United States Patent [19]

Dorler et al.

[11] Patent Number: 5,254,891
[45] Date of Patent: Oct. 19, 1993

[54] BICMOS ECL CIRCUIT SUITABLE FOR DELAY REGULATION

[75] Inventors: Jack A. Dorler, Holmes; Francesco M. Masci, Wappingers Falls, both of N.Y.

[73] Assignee: International Business Machines Corporation, Armonk, N.Y.

[21] Appl. No.: 870,654

[22] Filed: Apr. 20, 1992

[51] Int. Cl.⁵ .................... H03K 17/60; H03K 19/02
[52] U.S. Cl. ...................................... 307/570; 307/446
[58] Field of Search ............... 307/570, 446, 443, 597, 307/265, 590, 591, 263

[56]   References Cited
       U.S. PATENT DOCUMENTS

| | | | |
|---|---|---|---|
| 4,346,343 | 8/1982 | Berndlmaier et al. | 323/282 |
| 4,383,216 | 5/1983 | Dorler et al. | 323/282 |
| 4,445,083 | 4/1984 | DeFalco | 323/273 |
| 4,641,048 | 2/1987 | Pollock | 307/591 |
| 4,853,560 | 8/1989 | Iwamura et al. | 307/296.1 |
| 4,866,303 | 9/1989 | Kanai et al. | 307/443 |
| 4,902,915 | 2/1990 | Tran | 307/446 |
| 4,922,140 | 5/1990 | Gahle et al. | 307/591 |
| 4,926,069 | 5/1990 | Yamazaki | 307/446 |
| 4,939,389 | 7/1990 | Cox et al. | 307/443 |
| 4,980,586 | 12/1990 | Sullivan et al. | 307/591 |
| 4,999,519 | 3/1991 | Kitsukawa et al. | 307/446 |
| 5,001,365 | 3/1991 | Murabayashi et al. | 307/446 |

OTHER PUBLICATIONS

"Cascode ECL Circuit with AC Coupled Push-Pull in BICMOS"; by G. Boudon; IBM Technical Disclosure Bulletin; vol. 33, No. 10B, Mar. 1991; pp. 189–190.
"Delay Regulation—A Circuit Solution to the Power/Performance Tradeoff"; IBM Journal of Research and Development; vol. 25, No. 2 and 3, May 1981, by E. Berndlmaier et al.

*Primary Examiner*—Jin F. Ng
*Assistant Examiner*—Sinh Tran
*Attorney, Agent, or Firm*—Whitham & Marhoefer

[57]   ABSTRACT

CMOSFETs control the power in a bipolar logic gate to regulate its operating speed and hence its delay. In a specific embodiment of the invention, an n-channel CMOSFET controls the constant current through an emitter-coupled current switch, comprised of a pair of bipolar integrated circuit transistors. A p-channel CMOSFET, in series with each collector of the switch pair, establishes the collector voltage so as to maintain constant the output swing of the gate as the power through the gate is varied in order to regulate the gate delay. An error signal, indicative of factors that can cause variations in gate delay and the inverse of the error signal are generated by an on-chip circuit. The error signal is coupled to the n-channel CMOSFET and the inverse of the error signal is coupled to the p-channel CMOSFET. Thus, as the switch current is decreased in order to increase the gate delay, the collector impedance is simultaneously increased so the collector voltage, and hence the gate swing, remains constant. Similarly, when the switch current is increased, the collector impedance is decreased.

5 Claims, 4 Drawing Sheets

BICMOS ECL CIRCUIT SUITABLE FOR DELAY REGULATION

BACKGROUND OF THE INVENTION

1. Field of the Invention

This invention relates to an integrated circuit bipolar CMOS emitter-coupled logic gate with FET delay regulating elements.

2. Description of the Prior Art

As will be appreciated by those skilled in the art, the delay introduced by an integrated circuit logic gate may vary from chip to chip or even from one region on a single chip to another region on the same chip. Various factors can cause such gate delay variations between ostensibly identical gates. These factors include power supply variations, manufacturing process variations, temperature variations and the like.

As digital system technology progresses, both the cycle time of digital systems, and the individual delay introduced by logic circuits within the system, become shorter and shorter. Any tolerance for variations in logic circuit delay is a significant factor in limiting overall system performance.

U.S. Pat. Nos. 4,346,343 and 4,383,216, assigned to the assignee of this application, disclose an on-chip delay regulator circuit that varies the power in a logic circuit to minimize delay variations of the type described above. This delay regulator compares a periodic reference to an on-chip generated periodic signal sensitive to the factors that can cause variations in circuit delay. The comparison generates an error signal that is used to vary the power to the circuit. Increasing or decreasing the circuit power, increases or decreases the circuit speed, as necessary, to maintain a relatively constant circuit speed on each chip or in each region of a single chip.

SUMMARY OF THE INVENTION

An object of this invention is the provision of an improved integrated circuit bipolar CMOS, emitter-coupled logic circuit whose circuit speed can be varied by means of an on-chip regulator so as to provide a uniform circuit delay from chip to chip or chip region to chip region without change in output levels.

Briefly, this invention contemplates the provision of CMOSFETs to control the power in a bipolar logic gate, and hence regulate its delay. In a specific embodiment of the invention, an n-channel CMOSFET controls the constant current through an emitter-coupled current switch, comprised of a pair of bipolar integrated circuit transistors. A p-channel CMOSFET, in series with each collector of the switch pair, establishes the collector voltage so as to maintain constant the output swing of the gate as the power through the gate is varied in order to regulate the gate delay. An error signal, indicative of factors that can cause variations in gate delay and the inverse of the error signal is generated by an on-chip circuit. The error signal is coupled to the n-channel CMOSFET and the inverse of the error signal is coupled to the p-channel CMOSFET. Thus, as the switch current is decreased in order to increase the gate delay, the collector impedance is simultaneously increased so the collector voltage, and hence the gate swing, remains constant. Similarly, when the switch current is increased, the collector impedance is decreased.

In one embodiment of the invention, CMOSFETs in series with emitter-follower outputs regulate, in response to a delay signal. The regulation of transistor switch power and emitter-follower output power can be used advantageously in combination, or, in some applications, emitter-follower regulation may be used alone.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
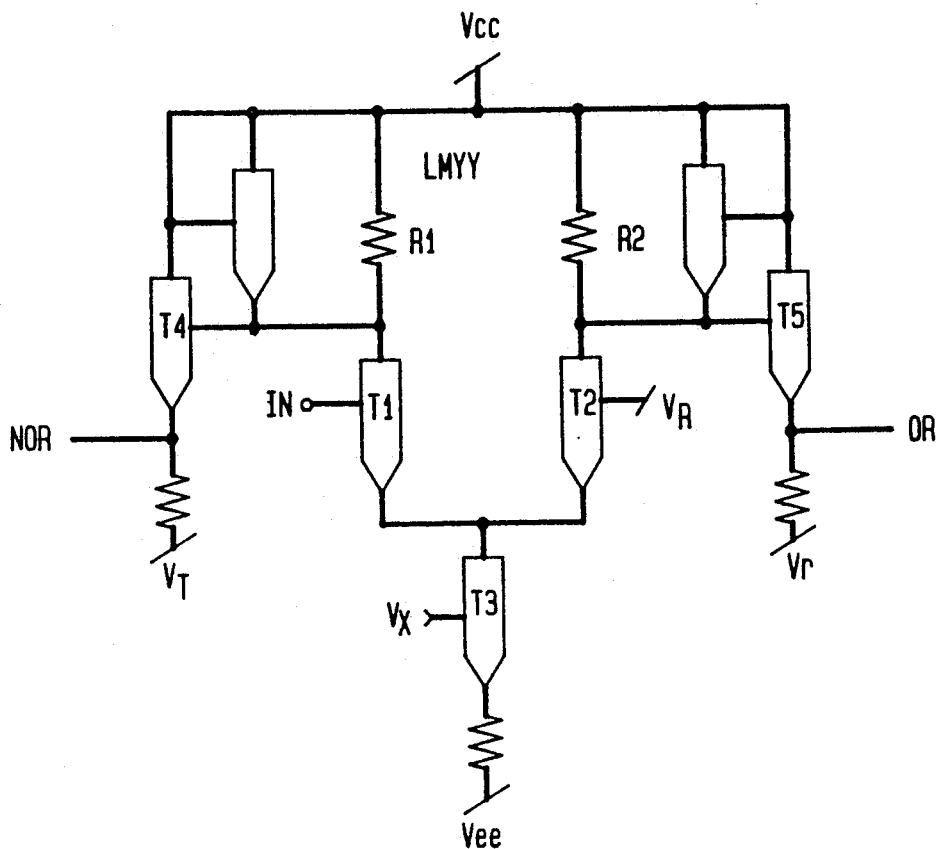
FIG. 1 is a schematic diagram of a prior art bipolar emitter-coupled logic gate with delay regulation.

Referring now to FIG. 1, it shows a typical prior art bipolar emitter-coupled logic gate with delay regulation of the type generally shown and disclosed and described in the aforementioned U.S. Pat. No. 4,383,216. The logic gate shown in FIG. 1 has a pair of NPN bipolar, emitter-coupled transistors T1 and T2 connected as a well-known current switch. The common emitters of the switch are connected to a negative potential source VEE through a delay regulating transistor T3. The collectors of T1 and T2 are coupled respectively by resistors R1 and R2 to a positive potential VCC. Emitter-follower transistors T4 and T5 couple respectively the collectors of the switch transistor T1 and T2 to the output terminals marked here as NOR and OR. Input terminal IN is coupled to the base of T1 and a reference potential Vr is coupled to the base of transistor T2.

The operation of the circuit shown in FIG. 1 is well known to those skilled in the art and will not be described here in detail. As disclosed in U.S. Pat. Nos. 4,346,343 and 4,383,216, which are incorporated herein by reference, a delay regulation signal Vx is coupled to the base of transistor T3 in order to regulate the current through the transistor switch and hence regulate its speed of operation. The delay regulation voltage Vx may be generated as disclosed in U.S. Pat. Nos. 4,346,343 and 4,383,216. There a periodic signal is generated on the chip. The frequency of which is a function of factors that effect circuit speed. For example, the periodic signal can be conveniently generated by a voltage-control oscillator whose input voltage is a function of factors that effect circuit speed. The output frequency of the voltage-controlled oscillator is compared with an off-chip reference signal, and any difference in signal frequencies generates an error signal that is used to generate an appropriate voltage Vx to increase or decrease the speed of the circuit.

Figure 2:
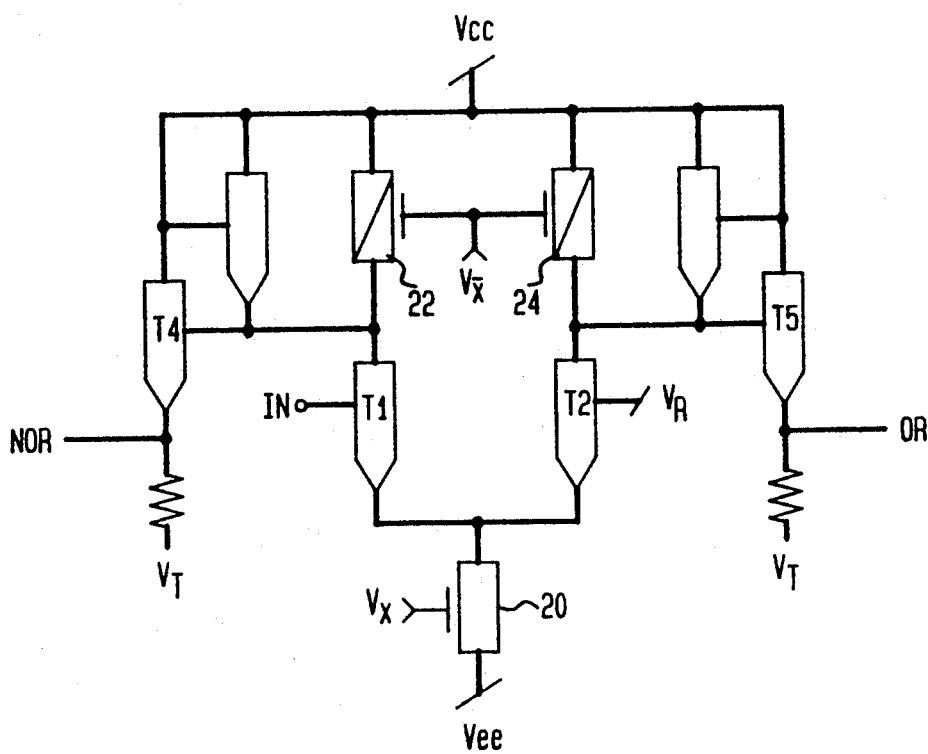
FIG. 2 is a schematic diagram of the basic logic gate shown in FIG. 1, with delay regulation in accordance with the teachings of this invention.

Referring now to FIG. 2, where like reference numerals have been used to identify like components from FIG. 1, it illustrates an emitter-coupled logic gate of the type disclosed in FIG. 1. Here, transistor T3 and its bias resistor have been replaced by an n-channel CMOSFET 20, and cathode resistors R1 and R2 have been replaced by p-channel CMOSFETs 22 and 24. The delay regulating voltage Vx is coupled to the gate of CMOSFET 20 in order to vary the switching current and hence the speed of the circuit. The inverted value of the voltage, $\overline{Vx}$, is coupled to the gate of CMOSFETs 22 and 24 in order to keep constant the collector voltages of T1 and T2, and hence keep constant the voltage swing of the gate despite changes in circuit speed.

Figure 3:
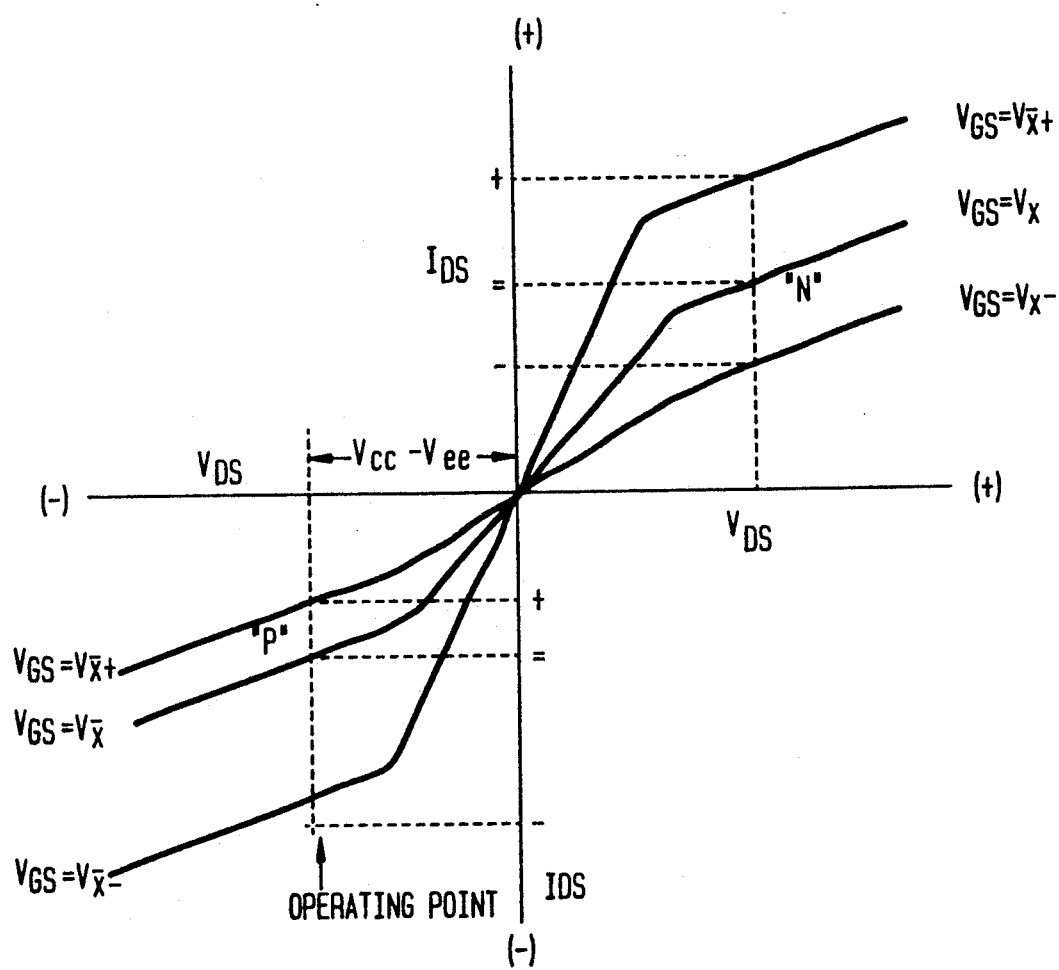
FIG. 3 is a diagram of typical current vs. voltage characteristics for the CMOSFET devices used in the circuit of FIG. 2.

Referring now to FIG. 3 as well as FIG. 2, the characteristic curve of drain-source voltage Vds vs. drain-source current Ids is shown for three values of Vx and $\overline{Vx}$; namely, a nominal value (Vx,$\overline{Vx}$) where the circuit speed is within specified tolerance, a value (Vx+, $\overline{Vx}$−) where the circuit speed is increased, and the value (Vx−, $\overline{Vx}$+) where the circuit speed is to be decreased. The characteristic of the n-channel CMOSFET 20 is shown in the upper right-hand quadrant of the drawing, and the characteristic of the p-channel COMOSFET 22 is shown in the lower left-hand quadrant.

Figure 4:
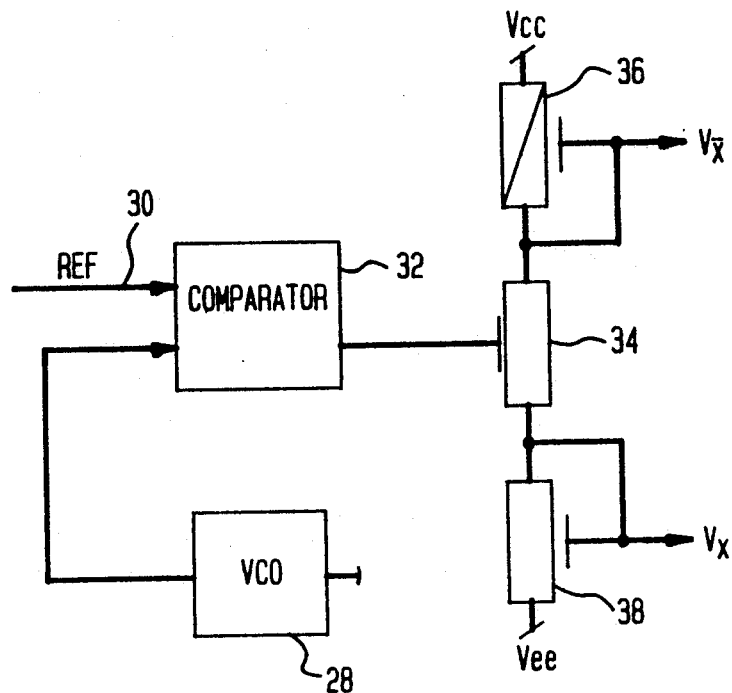
FIG. 4 is a schematic diagram of one circuit for generating an on-chip delay regulation error signal.

Referring now to FIG. 4, it shows one embodiment of an on-chip CMOSFET for generating the delay regulating voltages Vx and $\overline{Vx}$. The basic components of delay regulation, including a voltage-controlled oscillator 28, a reference frequency input 30, and a frequency comparator 32 are explained in detail in U.S. Pat. Nos. 4,383,216 and 4,346,343. The output of the comparator 32 is coupled to the gate of an n-channel CMOSFET 34. The source of CMOSFET 34 is coupled to the positive supply Vcc via a p-channel CMOSFET 36 that is connected as a two-terminal device and serves as a load for CMOSFET 34. Similarly, the drain of CMOSFET 34 is coupled to the negative supply Vee via an n-channel CMOSFET 38. The control voltages Vx and $\overline{Vx}$ are taken from the drain and source respectively of CMOSFET 34.

Figure 5:
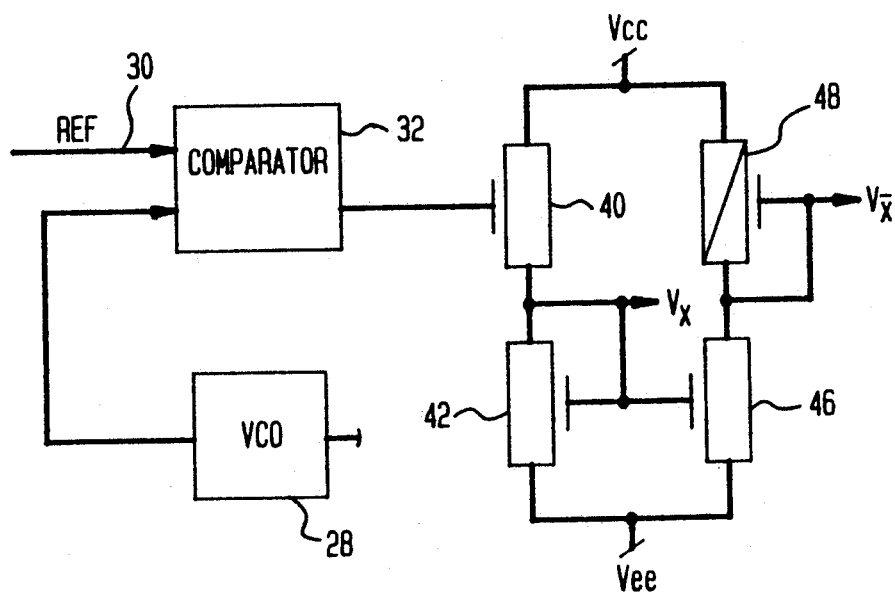
FIG. 5 is a schematic diagram similar to FIG. 5, of another circuit for generating an on-chip delay regulation error signal.

FIG. 5 shows an alternate circuit for generating the delay control signals Vx and $\overline{Vx}$. Here, the output of comparator 32 is coupled to the gate of n-channel CMOSFET 40 whose source is directly connected to Vcc and whose drain is connected to Vee via COMOSFET 42, which serves as a load. The output Vx is taken from the drain of FET 40. The inverted output $\overline{Vx}$ is generated by coupling the drain of FET 40 to the gate of n-channel CMOSFET 46 whose drain is connected to Vee and whose source is connected to Vcc via p-channel FET 48, which serves as a load.

Figure 6:
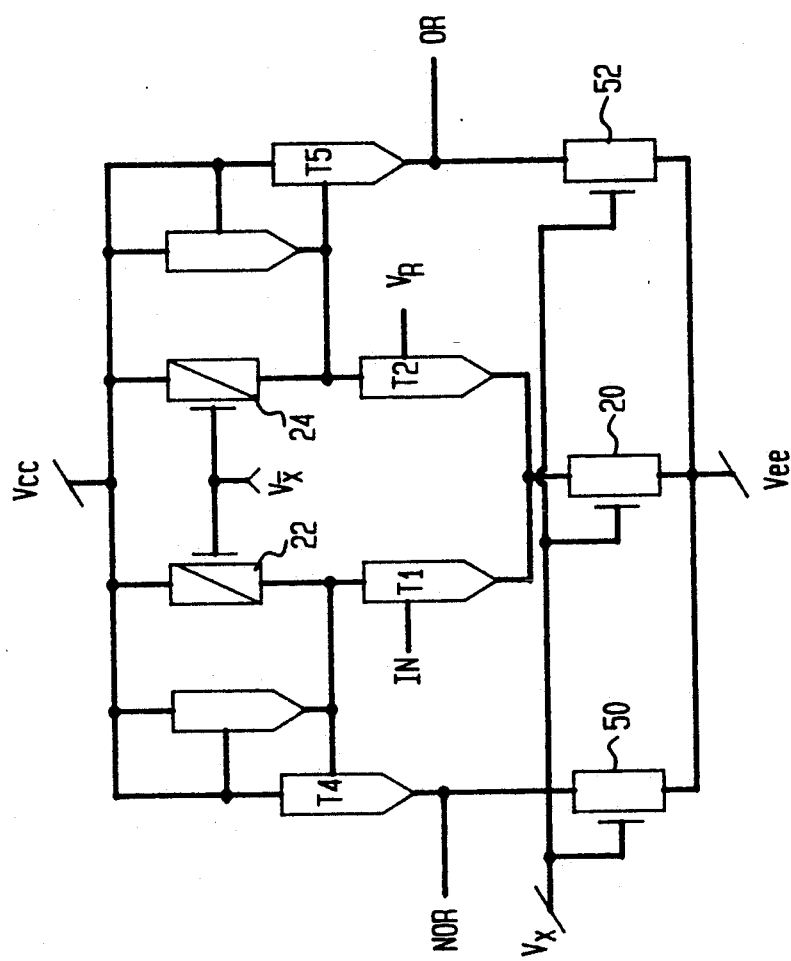
FIG. 6 is a schematic diagram similar to FIG. 2, showing the use of CMOSFET delay regulators in the emitter follower outputs of the gate.

Referring now to FIG. 6, it shows an embodiment of the invention in which n-channel CMOSFETs 50 and 52 are used to regulate current through the output emitter followers T4 and T5 respectively. The gates of FETs 50 and 52 are connected to Vx so that, as the emitter-coupled switch power increases, the emitter-follower power likewise increases, thereby further increasing the circuit speed. Similarly, a decrease in switch power is accompanied by a decrease in emitter-follower power, further decreasing circuit speed. It will be appreciated that in some applications an embodiment of the invention may use emitter-follower FETs alone for delay regulation.

As will be appreciated by those skilled in the art, an integrated circuit chip will have a large number of gates. All of the gates on the chip in a particular region of the chip will be coupled to the on-chip delay regulating voltages Vx and $\overline{Vx}$. In this way, delays from chip to chip or region to region can be equalized.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A bipolar emitter-coupled logic circuit responsive to a delay-regulating signal and its inverse that are variable over a continuous range above and below a nominal values in order to vary the operating speed of said logic circuit, comprising in combination:

a pair of bipolar transistors whose emitters are coupled to a constant current source to form an emitter-coupled current switch;

a first FET connected in series with a voltage source, said FET and said voltage source in combination comprising said constant current source, said first FET having a gate electrode, a source electrode, and a drain electrode;

a second and a third FET, each respectively connected in series with a collector of each of said pair of bipolar transistors, each of said second and third FETs having a gate electrode, a source electrode, and a drain electrode;

means to couple said variable delay-regulating signal to the gate electrode of said first FET to regulate a constant current through said emitter-coupled current switch; and means to couple the inverse of said variable delay-regulating signal to the gate electrode of each of said second and third FETs to regulate a current through the respectively collector of each of said bipolar transistors.

2. A bipolar emitter-coupled logic circuit as in claim 1, wherein said pair of bipolar transistors are each NPN transistors, said first FET is an n-channel FET and said second and third FETs are each p-channel FETs.

3. A bipolar emitter-coupled logic circuit responsive to a delay-regulating signal and its inverse that are variable over a continuous range above and below a nominal values in order to vary the operating speed of said logic circuit, comprising in combination:

a pair of bipolar transistors whose emitters are coupled to a constant current source to form an emitter-coupled current switch;

a bipolar emitter-follower transistor coupling a collector node of said emitter-coupled current switch to an output terminal;

an FET connected in series with said emitter-follower transistor, said FET having a gate electrode, a source electrode and a drain electrode; and means for coupling said gate electrode of said FET to said variable delay-regulating signal whereby said delay-regulating signal regulates a current through the emitter-follower.

4. A bipolar emitter-coupled logic circuit responsive to a delay-regulating signal and its inverse that are variable over a continuous range above and below a nominal values in order to vary the operating speed of said logic circuit, comprising in combination:

a pair of bipolar NPN transistors whose emitters are coupled to a constant current source to form an emitter-coupled current switch;

a first n-channel FET connected in series with a voltage source, said first n-channel FET and said voltage source in combination comprising said constant current source, said n-channel FET having a gate electrode, a source electrode and a drain electrode;

a pair of p-channel FETs, each connected in series respectively with a collector of each of said pair of bipolar NPN transistors, each of said p-channel FETs having a gate electrode, a source electrode and a drain electrode;

a bipolar NPN transistor emitter-follower transistor coupling a collector node of said emitter-coupled current switch to an output terminal; and a second n-channel FET transistor connected in series with said emitter-follower transistor;

means coupling said variable delay-regulating signal to the gate electrode of said first n-channel FET transistor and said second n-channel FET transistor; and means coupling the inverse of said variable delay-regulating signal to the gate electrodes of said p-channel FETs.

5. A bipolar emitter-coupled logic circuit responsive to a delay-regulating signal and its inverse that are variable over a continuous range above and below a nominal values in order to vary the operating speed of said logic circuit, comprising in combination:

a pair of NPN bipolar transistors whose emitters are coupled to a constant current source to form an emitter-coupled current switch;

a bipolar emitter-follower transistor coupling a collector node of said emitter-coupled current switch to an output terminal;

a n-channel FET transistor connected in series with said emitter-follower transistor, said n-channel FET transistor having a gate electrode, a source electrode and a drain electrode; and means for coupling said gate of said n-channel FET electrode to said variable delay-regulating signal whereby said variable delay-regulating signal regulates a current through the emitter-follower.

* * * * *